United States Patent [19]

Ohhata et al.

[11] 4,377,759
[45] Mar. 22, 1983

[54] OFFSET COMPENSATING CIRCUIT

[75] Inventors: Michinobu Ohhata, Kawasaki; Toshihiko Matsumura, Yokohama; Masao Yamasawa, Sagamihara; Takafumi Chujo, Yokohama; Masayuki Takahashi, Kawasaki, all of Japan

[73] Assignee: Konishiroku Photo Industry Co., Ltd., Japan

[21] Appl. No.: 227,094

[22] PCT Filed: Apr. 23, 1980

[86] PCT No.: PCT/JP80/00084
 § 371 Date: Dec. 25, 1980
 § 102(e) Date: Dec. 19, 1980

[87] PCT Pub. No.: WO80/02347
 PCT Pub. Date: Oct. 30, 1980

[30] Foreign Application Priority Data

Apr. 25, 1979 [JP] Japan .................................. 54-50236
Jun. 4, 1979 [JP] Japan .................................. 54-68802

[51] Int. Cl.³ .......................... H03K 5/08; H03F 1/34
[52] U.S. Cl. .................................... 307/491; 307/264; 307/494; 307/520; 328/128; 328/162; 330/9

[58] Field of Search ............... 307/491, 264, 494, 520; 328/128, 162, 163, 167, 165; 330/51, 107, 9

[56] References Cited

U.S. PATENT DOCUMENTS 3,764,922 10/1973 Gilbert et al. ....................... 328/162
3,772,604 11/1973 Hogg et al. ......................... 328/162

Primary Examiner—John Zazworsky
Attorney, Agent, or Firm—Jordan B. Bierman; Linda Bierman

[57] ABSTRACT

An offset compensating circuit is disclosed. The offset compensating circuit is inserted in a negative feedback loop of a circuit to be compensated and includes an integration circuit. The integration circuit includes a switching means mechanism and a switched capacitor type integrator. Said switching means mechanism produces either a positive reference voltage or a negative reference voltage in accordance with the polarity of the output signal of the circuit to be compensated. The positive or negative reference voltage is applied to the switched capacitor type integrator, which produces a compensating voltage signal to be combined with the input signal of the circuit to be compensated.

34 Claims, 13 Drawing Figures

OFFSET COMPENSATING CIRCUIT

DESCRIPTION

BACKGROUND OF THE INVENTION

The present invention relates to an offset compensating circuit and, more particularly, relates to an offset compensating circuit which may suitably be applied to, for example, a coding and decoding circuit employed in a PCM (pulse-code modulation) communication system.

Generally, in a circuit which includes an operational amplifier, a DC voltage error is often generated by the circuit due to various factors, for example, a mismatching between two transistors comprising a differential amplifier, or a temperature variation. The DC voltage error is usually called an "offset". The offset must be compensated for in such a circuit, in order to suppress the transmission of the offset therefrom. When an operational amplifier having an offset is included in a coding and decoding circuit, for example, the voice reproduced from the circuit changes for the worse in speech quality, and the noise produced from the circuit during intervals between speech may become high. Therefore, the offset must be suppressed for the purpose of improving the speech quality and decreasing the noise.

When such a coding and decoding circuit is comprised of discrete electrical components, it is relatively easy to suppress the offset. This is because the respective electric characteristics of the discrete electric components can easily be adjusted manually from the outside of the coding and decoding circuit, in order to suppress the offset. However, the latest tendency is to make the coding and decoding circuit in the form of an LSI (large-scale integration) circuit, because the coding and decoding circuits which are fabricated as LSI circuits have stable performances and can be manufactured at a relatively low price by mass produced. It should be understood that a coding and decoding circuit fabricated as an LSI circuit cannot be adjusted manually from the outside of the LSI and, accordingly, it is impossible to suppress the offset thereof by directly applying external means for suppressing the offset on the bare LSI chip itself. Such external means can, perhaps, be indirectly applied on the LSI chip via input, output pins extending therefrom. For example, such external means can include an adjusting capacitor or an adjusting resistor, which are connected to corresponding input/output pins. However, in the mass produced process, it is not desirable to connect such external means to the corresponding input/output pins of each of the LSI chips one by one, because the mass produced LSI chips having such external means do not exhibit stable performance and cannot be fabricated at a low price. Thus, it is desirable to suppress the offset without attaching any such external means to the LSI circuits.

SUMMARY OF THE INVENTION

An object of the present invention, therefore, is to provide an offset compensating circuit to be accommodated inside a circuit to be compensated as one body, without attaching thereto any external means for suppressing the offset.

According to the present invention, in a circuit which is to be compensated and which receives an input voltage and produces an output voltage through a predetermined operation, a corrective voltage is combined with the input voltage of said circuit through a feedback loop, the corrective voltage varying stepwisely toward a negative voltage or a positive voltage in accordance with the variation of the output voltage toward a positive voltage or negative voltage, respectively, along a very gentle stepwise slope. In this case, it is preferable to produce said corrective voltage by means of a so-called switched capacitor filter.

It should be noted that the present invention relies on the fact that the output voltage produced from a circuit to be compensated, such as the above mentioned coding and decoding circuit, varies depending upon conditions; that is, the probablity of the occurrences of a positive output voltage is almost the same as the probability of the occurrences of a negative output voltage during the generation of the output voltage signal from the circuit to be compensated, when the output is considered for a relatively long time, if no offset is induced therein.

BRIEF DESCRIPTION THE DRAWING

DESCRIPTION OF THE PREFERRED EMBODIMENTS

The present invention will become more apparent from the detailed description of the preferred embodiments presented hereinafter, with reference to the accompanying drawings.

Figure 1:
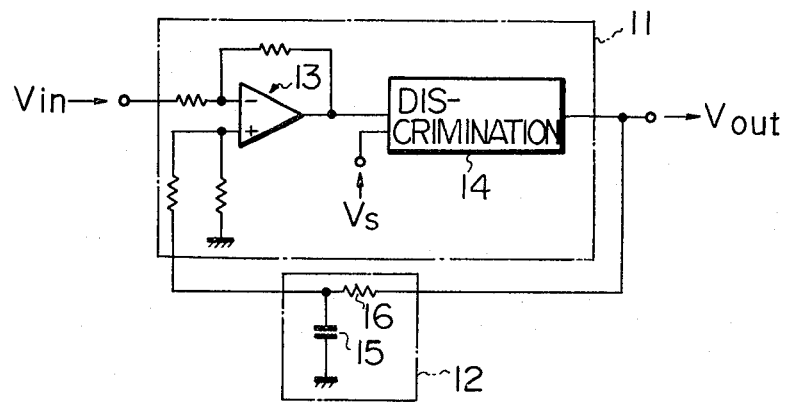
FIG. 1 is a block diagram of one example of a circuit which employs an offset compensating circuit of the prior art therein.

Referring to FIG. 1, which is a block diagram of one example of a circuit which employs an offset compensating circuit of the prior art, the reference numeral 11 represents a circuit to be compensated which receives an input voltage signal $V_{in}$ and which produces an output voltage signal $V_{out}$ through a predetermined operation. The reference numeral 12 represents an offset compensating circuit. The circuit 11 is comprised of, for example, an operational amplifier 13 acting as an analog adder and a discriminating circuit 14. The discriminating circuit 14 is provided with a preset voltage $V_s$ and produces a positive or negative output voltage signal $V_{out}$ in accordance with the result of a comparison between the level of the preset voltage $V_s$ and the level of the output voltage produced by the operational amplifier 13. The output voltage signal $V_{out}$ is necessary for performing a coding procedure in the coding and decoding operation. In this case, the input voltage signal $V_{in}$ may correspond to input voice signal.

Since the circuit 11 includes the operational amplifier 13 therein, an offset is induced in this circuit 11. The offset may be induced due to not only the presence of the operational amplifier, but also the presence of, for example, a filter (not illustrated in FIG. 1) comprised of the operational amplifier. The filter may usually be located at a preceding stage with respect to the circuit 11. In any case, if an offset is contained in the output voltage signal $V_{out}$, the level of the resultant output voltage signal $V_{out}$ deviates from the true level thereof by the level of the offset. Consequently, as previously mentioned, when the offset is conveyed to the coding and decoding circuit, the voice reproduced from the circuit changes for the worse in speech quality and the noise produced from the circuit between speech intervals may become high. Thus, in order to suppress the offset, the offset compensating circuit 12 is incorporated in the circuit 11.

Regarding the above mentioned voice signal, it is a generally known fact that the probability of a positive amplitude in the voice signal is almost the same as the probability of a negative amplitude if the voice signal lasts for a relatively long time. In other words, the low frequency component of the output voltage signal $V_{out}$ very slowly varies between the positive voltage potential and the negative voltage potential, with respect to the ground voltage potential of the circuit. Accordingly, if the very slow variation of the output voltage signal $V_{out}$ tends toward the positive voltage potential rather than the negative voltage potential, it may be concluded that a positive offset is being induced in the circuit. Contrary to this, if the very slow variation of the output voltage signal tends toward the negative voltage potential rather than the positive voltage potential, it may be concluded that a negative offset is being induced in the circuit. Therefore, the offset can be suppressed by, firstly, extracting the positive or negative low frequency component of the output voltage signal $V_{out}$ by means of a low-pass filter and, secondly, by applying the extracted low frequency component of the output voltage signal $V_{out}$ to the input voltage signal $V_{in}$ via a negative feedback loop. A function similar to that accomplished by the low-pass filter is performed, in FIG. 1, by the offset compensating circuit 12, which is comprised of both a capacitor 15 and a resistor 16 in the form of an RC integration circuit.

Regarding the RC integration circuit, the capacitance value C of the capacitor 15 and the resistance value R of the resistor 16 must both be large in value. This is because the RC integration circuit must have a very large time constant so as to follow the above mentioned very low frequency component of the output voltage signal $V_{out}$. However, in an LSI circuit, setting a resistor having such high resistance value aside, a capacitor having such a high capacitance value cannot be accommodated in the LSI chip. This is the reason the aforementioned external means, such as the RC electrical components, must be connected to the LSI circuit via corresponding input/output pins extending therefrom. It should be understood that, as previously mentioned, if such external means are attached to the LSI circuits one by one, stable performance of each mass produced LSI circuit and low price cannot be expected.

In the present invention, the offset compensating circuit can be accommodated in the LSI circuit as one body, and accordingly, no additional and external means for suppressing the offset are required to be attached thereto.

Figure 2:
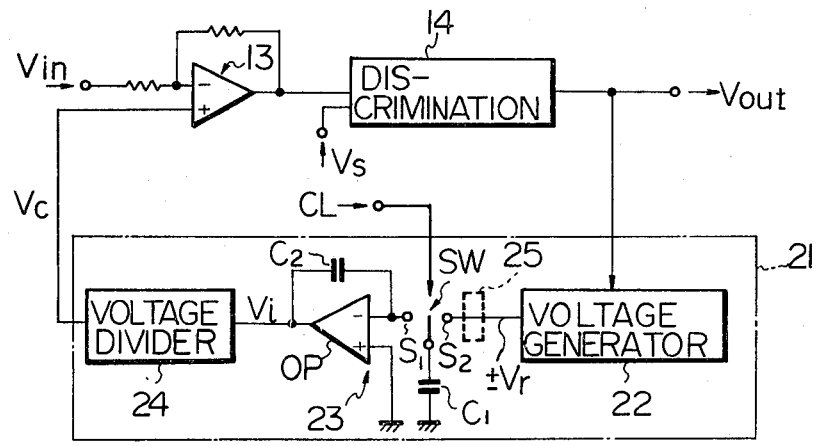
FIG. 2 is a block diagram of one example of a circuit which employs an offset compensating circuit of a first embodiment according to the present invention.
Figure 3:
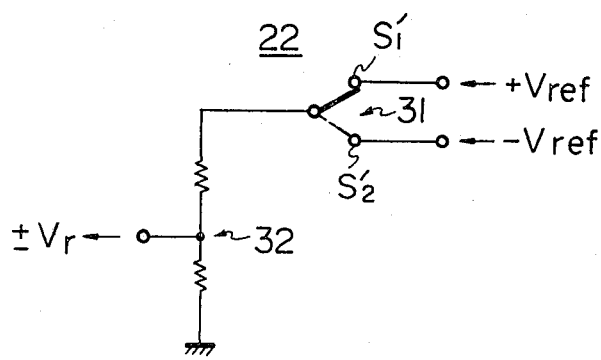
FIG. 3 is a circuit diagram of one example of a bipolar reference voltage generator 22 illustrated in FIG. 2.

In FIG. 2, which is a block diagram of one example of a circuit which employs an offset compensating circuit of a first embodiment according to the present invention, the members which have the same reference numerals and symbols as those illustrated in FIG. 1 are identical to those in FIG. 1. In FIG. 2, the reference numeral 21 represents the offset compensating circuit of the first embodiment according to the present invention, which circuit 21 is mainly comprised of a bipolar reference voltage generator 22, an integration circuit 23 and a voltage divider 24. An essential feature of the present invention resides in the integration circuit 23. The circuit 23 is comprised of a sample-and-hold capacitor $C_1$, a switch SW, an integration capacitor $C_2$ and an operational amplifier OP, and these members form a so-called switched capacitor type integration circuit. The switched capacitor type integration circuit 23 replaces the typical RC integration circuit. The advantage of the integration circuit 23 over the typical RC integration circuit resides in the fact that the resistance value R of the resistor in the typical integration circuit and the capacitance value C of the capacitor in the typical integration circuit the functions of both of which are replaced by the offset compensating circuit of the present invention, can be far larger than the values which are practicable in the typical integration circuit. Either one of the bipolar reference voltages $\pm V_r$ produced from the generator 22 is supplied to the sample-and-hold capacitor $C_1$ via the contact $S_2$ of the switch SW, and the capacitor $C_1$ is charged to the level of the supplied voltage. Then, the charged voltage at the capacitor $C_1$ is discharged to the integration capacitor $C_2$ via the contact $S_1$ of the switch SW. The contacts $S_1$ and $S_2$ of the switch SW become conductive alternately in synchronism with the clock pulses CL having a frequency of $f_1$, which pulses CL are adapted for controlling the switch SW. One example of the bipolar voltage generator 22 is illustrated in FIG. 3. In FIG. 3, the generator 22 is comprised of a switch 31 having contacts $S_1'$ and $S_2'$ and a voltage divider 32 made of at least two resistors. The middle connecting point of these two resistors produces a positive reference voltage $+V_r$ or a negative reference voltage $-V_r$ in accordance with the condition of the switch 31. The condition of the switch 31 is determined by the output from the discriminating circuit 14 (see FIG. 2). The contacts $S_1'$ and $S_2'$, respectively, receive reference voltages $+V_{ref}$ and $-V_{ref}$. These reference voltages $\pm V_{ref}$ are pre-existing reference voltages which are originally generated in the coding and decoding circuit.

The function of the switched capacitor type integration circuit 23 illustrated in FIG. 2 is explained below. The pseudo resistance value R of the resistor developed in the circuit 23 is expressed by the following equation (1).

$$R = V/I \quad (1)$$

where, the symbol I denotes the amplitude of the current which flows to the capacitor $C_1$ and the symbol V denotes the level of the voltage developed at the common contact of the switch SW. The current I can be expressed by the following equation (2).

$$I = dQ/dt \quad (2)$$

where, the symbol t denotes time and the symbol Q denotes amount of the charge stored in the capacitor $C_1$. The equation (2) may also be rewritten in the form of the following equation (3).

$$Q = C_1 \times V \times f_1 \times t \quad (3)$$

Thus, the current I can be expressed by the following equation (4) in view of the above recited equations (2) and (3).

$$I = C_1 \times V \times f_1 \quad (4)$$

When the equation (4) is substituted for the above recited equation (1), the following equation (5) can be obtained.

$$R = 1/(C_1 \times f_1) \quad (5)$$

Consequently, the pseudo RC time constant $\tau$ of the integration circuit 23 can be defined by the following equation (6) based on the above recited equation (5).

$$\tau = C_2 \times R = C_2/(C_1 \times f_1) \quad (6)$$

As previously mentioned, in the present invention, $\tau$ must be selected to be a considerably large value, so as to follow only very low frequency components of the signal which is obtained by removing the voice signal from the output voltage signal $V_{out}$. According to the above recited equation (6), the value of the time constant $\tau$ can be made large by increasing the ratio of $C_2/C_1$ or lowering the frequency of $f_1$. In this case, since the frequency $f_1$ is selected to be 8 KHz in accordance with the so-called sampling theorem, the value of the time constant may be increased by increasing the ratio of $C_2/C_1$. It should be understood that, since the ratio of $C_2/C_1$ is the relative value between the capacitance values $C_1$ and $C_2$, the time constant can be increased without increasing these capacitance values $C_1$ and $C_2$ themselves. That is, the time constant can be increased by two capacitors having very small capacitance values. As a result, the capacitor 15 (see FIG. 1) can be replaced by two capacitors $C_1$ and $C_2$ having much smaller capacitance values than the capacitance value of the capacitor 15, without losing the results obtained by the typical integration circuit. Accordingly, such capacitors ($C_1$, $C_2$) having very small capacitance values can easily be accommodated in an LSI chip as one body.

Figure 4:
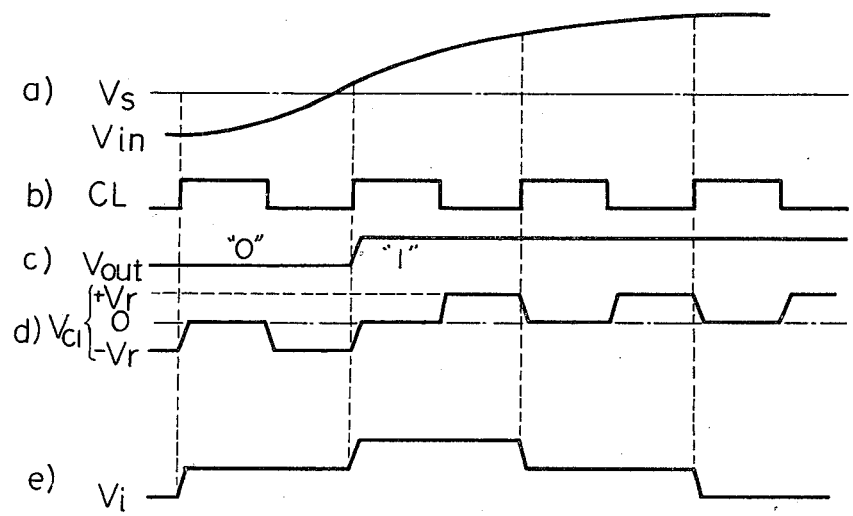
FIG. 4 depicts waveforms of signals appearing in the circuit illustrated in FIG. 2.

The operation of the circuit illustrated in FIG. 2 will be explained below with reference to FIG. 4, which depicts waveforms of signals appearing in the circuit of FIG. 2. Referring to both FIGS. 2 and 4, and taking as an example the case wherein the preset voltage $V_s$ (having a constant level, as indicated by long and short dash lines in row (a)) is applied to the discriminating circuit 14, and wherein the input voltage signal $V_{in}$ varies along the solid line in the same row (a), the difference in level between the voltage $V_s$ and $V_{in}$ is detected by the discriminating circuit 14. The resultant signal produced from the circuit 14 is obtained as the output voltage signal $V_{out}$. Thus, the output voltage signal $V_{out}$ becomes a "0" level or "1" level signal, as shown in row (c), in accordance with the relationship between the voltages $V_s$ and $V_{in}$. The information indicating a "0" or "1" level of the voltage $V_{out}$ is also applied to the bipolar reference voltage generator 22. Then, the generator 22 produces the positive reference voltage $+V_r$ or the negative reference voltage $-V_r$, respectively, in accordance with said information indicating "1" or "0". During the production of the reference voltage $\pm V_r$ by the generator 22, the switch SW is operated in accordance with the clock pulses (row (b)) in order to periodically charge the capacitor $C_1$ and then transfer this charge to the capacitor $C_2$. Every time a transfer of charge is conducted, the operational amplifier OP achieves the function of integration, so that the output voltage $V_i$ from the integration circuit 23 varies in a stepwise manner as seen in row (e). Since the charge stored in the capacitor $C_1$ (representing row d)) is applied to the inverting input (−) of the operational amplifier OP, the output voltage $V_i$ increases in the direction of a positive voltage, so long as the negative reference voltage $-V_r$ is applied to the capacitor $C_1$. Contrary to this, the output voltage $V_1$ decreases in the direction of a negativbe voltage so long as the positive reference voltage $+V_r$ is applied to the capacitor $C_1$. The output voltage $V_i$ may be voltage-divided before being applied as an input to the operational amplifier 13, along with the input voltage signal $V_{in}$. Thus, negative feedback with respect to the input voltage signal $V_{in}$ results. When the input voltage signal $V_{in}$ represents the voltage of a voice signal, the probability of the occurrences of a negative ("0") output voltage signal $V_{out}$ is almost the same as the probability of the occurrences of a positive ("1") output voltage signal $V_{out}$ over the long run if there is no offset in the circuit to be compensated for. In this case, the output voltage $V_i$ of the integration circuit 23 becomes zero. However, under actual conditions, an offset is always induced in the circuit, and accordingly, the output voltage $V_i$ is always developed, and it is then negatively fed back to the input voltage signal $V_{in}$. As a result, the probability of the occurrences of a "0" level output voltage $V_{out}$ gradually becomes almost the same as the probability of a "1" level output voltage $V_{out}$, and accordingly, the offset is gradually suppressed toward zero. Thus, the offset can be compensated for. As previously mentioned, since the offset is composed of very low frequency components, the time constant of the integration circuit 23 becomes very long. From this point of view, the integration circuit 23 is considered to be a low pass filter.

As previously mentioned, since the clock pulses CL have a frequency of 8 KHz according to the sampling theorem, the number of the sampling points is very large. Consequently, if the capacitor $C_1$ is successively charged by the voltage $+V_r$ or $-V_r$ for a long time, the peak value of the output voltage $V_i$ tends toward a considerably high level. In this case, the increased voltage $V_i$ will have a bad effect on the input voltage signal $V_{in}$ rather than a good effect thereon, and distortion may result. In order to eliminate this possibility, a voltage divider 24 (FIG. 2) is introduced in the circuit 21. Thus, the increased voltage $V_i$ is reduced to a relatively low voltage through the divider 24. This same function of reducing the voltage $V_1$ can also be achieved by a voltage divider 25, which is illustrated by a dotted line in FIG. 2.

Figure 5:
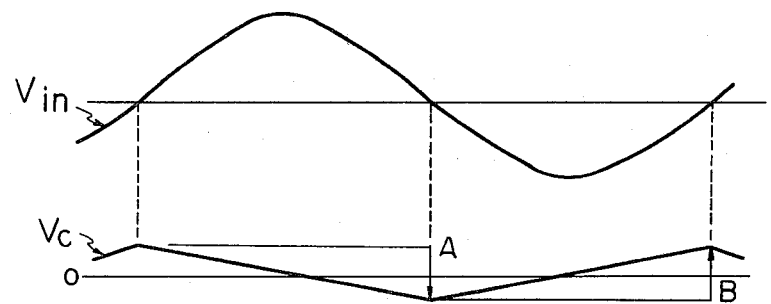
FIG. 5 depicts waveforms of signals used for schematically explaining the offset compensating operation under control of the circuit 21 illustrated in FIG. 2.

FIG. 5 depicts waveforms of signals used for schematically explaining the offset compensating operation under control of the circuit 21 illustrated in FIG. 2. In FIG. 5, the reference symbol $V_{in}$ indicates the waveform of the above mentioned input voltage signal having, for example, a sine wave. The reference symbol $V_c$ indicates the waveform of a voltage which is produced by the circuit 21 and applied to the input voltage signal $V_{in}$ in a negative feedback mode. The negative feedback mode is maintained in a stabilized condition when the amount of positive integration (indicated by an arrow B) is equal to the amount of negative integration (indicated by an arrow A). If a positive or negative offset is combined with the input voltage signal $V_{in}$, then the amount of the negative integration (A) or positive integration (B) is increased, respectively, by the amount of the absolute value of said positive and negative offset.

Figure 6:
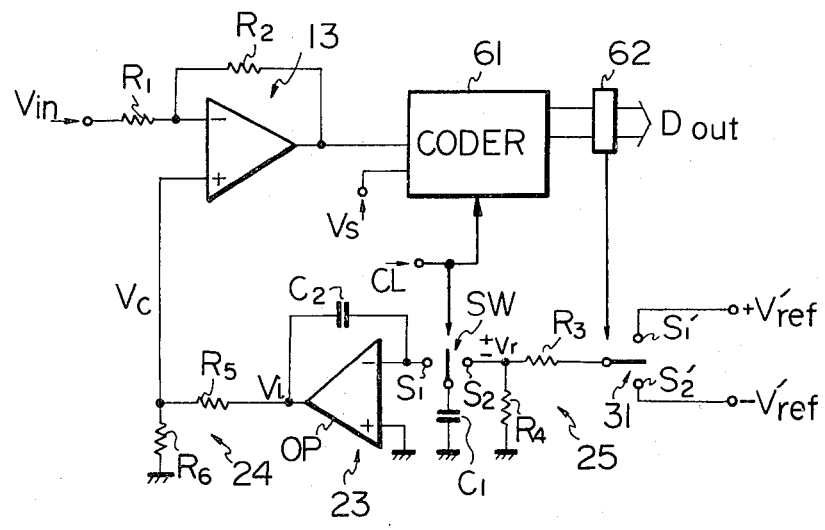
FIG. 6 is a circuit diagram of one example of a coding circuit which is combined with the offset compensating circuit 21 illustrated in FIG. 2.

FIG. 6 is a circuit diagram of one example of a coding circuit which is combined with the offset compensating circuit 21 illustrated in FIG. 2. In this Figure, the members which have the same reference numerals and symbols as those indicated in FIGS. 2 and 3 are identical to those in FIGS. 2 and 3. The input voltage signal $V_{in}$ of an analog voice signal is applied through operational amplifier 13 to a coder 61, made of an analog/digital converter. The coder 61 performs a similar function to that of the discriminating circuit 14 (FIG. 2), that is, coder 61 produces output data $D_{out}$ composed of, for example, an 8 bit PCM communication signal. The most significant bit of the 8 bits is usually called a sign bit. The sign bit indicates positive or negative, respectively, when, in FIG. 4, the level of the input voltage signal $V_{in}$ is higher or lower than the level of the preset voltage $V_s$. The remaining 7 bits of said 8 bits indicates the amplitude of the input voltage signal $V_{in}$, but these 7 bits are not pertinent to the present invention. The above mentioned sign bit is extracted by a sign bit extracting circuit 62. Then, one of the contacts $S_1'$ and $S_2'$ of the switch 31 is caused to be conductive, that is, it is electrically connected to resistor $R_3$, according to the polarity of said sign bit. The contacts $S_1'$ and $S_2'$ receive, respectively, positive and negative reference voltages $+V_{ref}'$ and $-V_{ref}'$. When the levels of these voltages $\pm V_{ref}'$ are relatively low, a voltage divider, such as the voltage divider 32 (FIG. 3), is not necessary. A sign bit which is negative corresponds to the "0" level in FIG. 4, while a sign bit which is positive corresponds to the "1" level in FIG. 4. Thus, the capacitor $C_1$ is charged by the reference voltage $+V_r$ or $-V_r$ according to the polarity of the sign bit. Resistors $R_3$ and $R_4$ comprise the aforesaid voltage divider 25 (FIG. 2). The operational amplifier OP of the integration circuit 23 produces the output voltage $V_i$ (see FIG. 4), and the voltage $V_i$ is combined, as an offset compensating signal, with the input voltage signal $V_{in}$ in a negative feedback mode. Resistors $R_5$ and $R_6$ comprise the aforesaid voltage divider 24 (FIG. 2).

When determining the values of the capacitors $C_1$ and $C_2$ and the resistors $R_5$ and $R_6$, the following fact must be taken into consideration.

Waveform distortion must be taken into consideration, which distortion may be induced in the input voltage signal $V_{in}$ due to the superposition of the compensating voltage $V_c$ onto the signal $V_{in}$. This is because the voltage which is applied to the coder 61 represents not the input voltage $V_{in}$ itself but the voltage $(V_{in}+V_c)$. If the level of the voltage $V_c$ becomes relatively high compared to that of the input voltage $V_{in}$, the above mentioned distortion cannot be disregarded. The lower the level of the input voltage $V_{in}$, the greater the distortion. Also, the lower the frequency of the input voltage signal $V_{in}$ the greater the distortion. Taking as an example the case where the frequency of the output data signal $D_{out}$ is 300 Hz and the switches SW and 31 (see FIG. 6) are actuated with a sampling frequency of 8 KHz, the sampling operations for the input voltage signal $V_{in}$ are performed about fourteen times sequentially during a half period of the input voltage signal $V_{in}$. In this example, the sign bit extracting circuit 62 (FIG. 6) successively produces fourteen of the same polarity sign bits, either positive or negative, during the half period of the voltage signal $V_{in}$, and therefore the output voltage $V_i$, and accordingly the offset compensating voltage $V_c$, increases or decreases linearly along fourteen steps (refer to the steps of the voltage $V_i$ in row e) of FIG. 4). As a result, the peak value of the offset compensating voltages $V_c$ gradually reaches a very high level. Therefore, it is necessary to suitably select the values of the ratios $R_4/R_3$, $R_6/R_5$ and $C_2/C_1$ so that the above mentioned peak value of the voltage $V_c$ is far lower than the minimum resolution level of the coder.

Thus, the present invention provides an offset compensating circuit which can easily be accommodated in an LSI circuit as one body, because it not necessary to employ capacitors having very large capacitance values in the circuit to be compensated.

Figure 7:
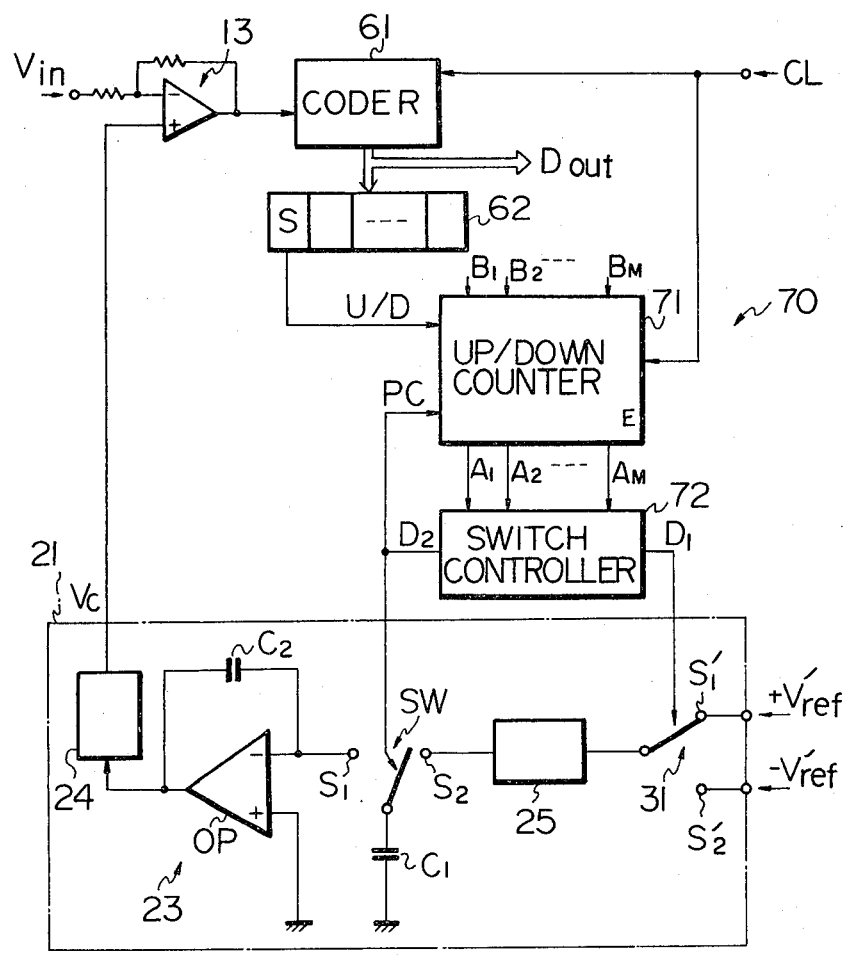
FIG. 7 is a circuit diagram of one example of a coding circuit which employs an offset compensating circuit of a second embodiment according to the present invention.

FIG. 7 is a circuit diagram of one example of a coding circuit which employs an offset compensating circuit of a second embodiment according to the present invention. In FIG. 7, the members which have the same reference numerals and symbols as the those indicated in FIGS. 2, 3 and 6 are identical to the members in FIGS. 2, 3 and 6. In this regard, members 71 and 72 are newly introduced members in the offset compensating circuit of the second embodiment. As seen in FIGS. 2 and 6, according to the above explained first embodiment, the switches SW and 31 are directly actuated by the clock pulses CL and the sign bit signal supplied from the sign bit extracting circuit 62. However, according to this second embodiment, the switches SW and 31 are actuated by the same signals via a buffer means 70 which is specifically comprised of an up-/down counter 71 and a switch controller 72. The buffer means 70 is useful for eliminating a disadvantage in the offset compensating circuit according to the first embodiment. That is, the first embodiment has the disadvantage that, as previously mentioned, distortion may be induced in the input voltage signal $V_{in}$. This is because the offset compensating voltage $V_c$ is continuously superposed onto the input voltage signal $V_{in}$. Thus, the voltage which is applied to the coder 61 is not exactly proportional to the true voltage of the input voltage signal $V_{in}$, but instead is proportional to a voltage which is equal to the sum of $V_{in}$ and $V_c$.

Returning to FIG. 7, the buffer means 70 can eliminate the above mentioned disadvantage of the first embodiment without producing a disadvantage similar to the above mentioned disadvantage of said control means. In other words, the buffer means 70 is not responsive to the variation of the output data signal $D_{out}$, which is induced by the voice signal to be transmitted, but is responsive only to the variation of said output data signal $D_{out}$, which is induced by the offset. It should be noted that the buffer means 70 can also be accommodated, together with the offset compensating circuit 21, in the LSI circuit as one body. The control signals $D_1$ and $D_2$ from the switch controller 72 actuate the switches 31 and SW and drive the integration circuit 23. The positive or negative compensating voltage $V_c$ from the circuit 23 is applied to the analog adder 13 in response to a negative or positive offset, respectively. The coder 61 receives the output signal from the adder 13 and codes the signal. The coded signal, that is the output data signal $D_{out}$, is stored in the sign bit extracting circuit 62, made of a register. The most significant bit of the register (62) indicates the sign bit S of the output data signal $D_{out}$. The sign bit S is applied, as an up/down specifying bit U/D, to the up/down control terminal of the up/down counter 71. The counter 71 counts the clock pulses CL to increase or decrease the count number in accordance with the up/down specifying bit U/D. The switch controller 72 receives the digital output $A_1, A_2 \ldots A_M$ and produces the control signals $D_1$ and $D_2$.

The sign bit S of the register 62 is updated every time a sampling operation for obtaining the output data signal $D_{out}$ is performed. When the bit U/D becomes logic "1" or "0," the counter 71 counts the clock pulses CL to increase or decrease the count number, respectively. The count number of the counter 71 varies within the range between (0, 0, 0 ... 0) and (1, 0, 0 ... 0). In this case, the reference count number of the counter 71 is preset to be, for example (0, 1, 0 ... 0). The reference value (0, 1, 0 ... 0) is given, in advance, by external preset data $(B_1, B_2 \ldots B_M)$. This data $(B_1, B_2 \ldots B_M)$ is preset into the counter 71 every time the control signal $D_2$ is provided from the controller 72 and applied, as a preset command pulse PC, to the counter 71.

Since the polarity of the voice signal varies positive and negative alternately, the count number of the counter 71 changes from (0, 1, 0 ... 0) toward (1, 0, 0, ... 0) or (0, 0, 0 ... 0). In this case, since the probabilities of the occurrences of the positive and negative voice signals are almost the same as each other, the count number of the counter 71 should tend toward (0, 1, 0 . . . 0) when a voice signal is generated for a long time. However, the count number will deviate from the preset value (0, 1, 0 . . . ) if a voice signal having low frequency, such as 300 Hz, is generated. In this case, when the sampling frequency is 8 KHz, the sampling operations are achieved about fourteen times during a half period of such a voice signal. Therefore, the up/down specifying bits U/D become fourteen successive logic "0"s or fourteen successive logic "1"s. Thus, the digital output $(A_1, A_2 \ldots A_M)$ of the counter 71 approaches (0, 0, 0 ... 0) or (1, 0, 0 ... 0). However, an underflow or an overflow of the count number does not occur in the counter 71. This is because the number of bits of the counter 71 is selected so as not to allow such an underflow or overflow. For example, the counter 71 is made of a 5 bit counter. As a result, such an underflow or overflow of the counted number from the counter 71 cannot be generated during the generation of the voice signal for a long time, if not offset exists. Accordingly, the switch controller 72 and also the circuit 21 are not actuated, and as a result, no offset compensating voltage $V_c$ is combined with the input voltage signal $V_{in}$.

However, if an offset is contained in the output data signal $D_{out}$, the up/down specifying bits U/D will tend towards logic "1" bits or logic "0" bits, and as a result an overflow or underflow will occur at the digital output $(A_1, A_2 \ldots A_M)$ of the counter 71. At the same time, the control signals $D_1$ and $D_2$ are produced by the switch controller 72 and the offset compensating circuit 21 is actuated. If an underflow occurs (there is a negative offset), a positive offset compensating voltage $V_c$ is applied to the adder 13. Contrary to this, if an overflow occurs (there is a positive offset), a negative offset compensating voltage $V_c$ is applied to the adder 13.

The occurrence of the control signal $D_2$ indicates that either an overflow or underflow has occurred. The control signal $D_1$ indicates the polarity of the offset in the data signal $D_{out}$. If a positive offset exists, the control signal $D_1$ makes the contact $S_2'$ of the switch 31 conductive, so that the negative reference voltage $-V_{ref}$ is supplied to the capacitor $C_1$. Contrary to this, if a negative offset exists, the control signal $D_1$ makes the contact $S_2'$ non-conductive and the contact $S_1'$ conductive, so that the positve reference voltage $+V_{ref}$ is supplied to the capacitor $C_1$.

On the other hand, the control signal $D_2$ normally makes the contact $S_2$ of the switch SW conductive, but it may make the contact $S_2$ non-conductive and the contact $S_1$ conductive. In such a case the charge stored in the capacitor $C_1$ is transferred to the integration circuit 23 so as to produce the offset compensating voltage $V_c$.

As mentioned above, the offset compensating circuit 21 provides with the buffer means 70 is not responsive to that portion of the data $D_{out}$ representing the voice signal itself, but is responsive only that portion of the data signal $D_{out}$ which is induced by the offset. Consequently, the coder 61 can receive a signal representing the true input voltage $V_{in}$, except for when an offset is present.

Figure 8:
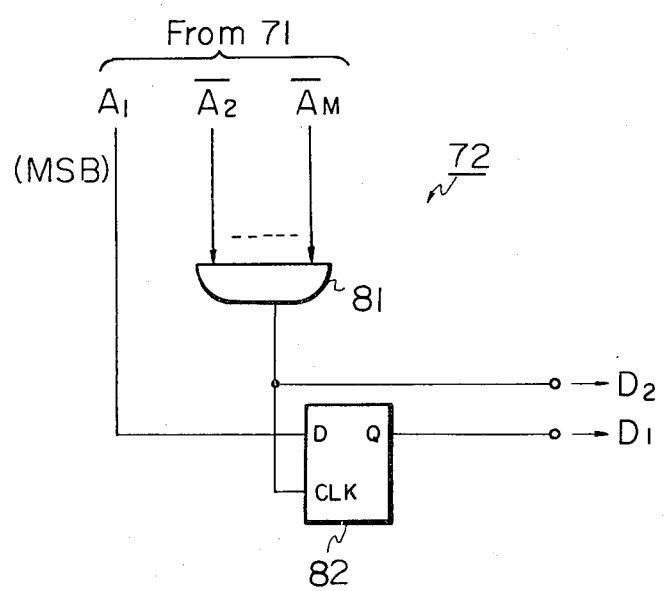
FIG. 8 is a circuit diagram of one example of a switch controller 72 illustrated in FIG. 7.

FIG. 8 is a circuit diagram of one example of the switch controller 72 illustrated in FIG. 7. As seen from FIG. 8, the circuit 72 is comprised of an AND gate 81 and a D flip-flop 82. If it is assumed that the preset value is expressed by (0, 1, 0, 0, 0, 0), then the above mentioned overflow can be expressed by ($\underline{1}$, 0, 0, 0, 0, 0) and the above mentioned underflow can be expressed by the logic ($\underline{0}$, 0, 0, 0, 0, 0). Therefore, when an overflow or underflow occurs, every bit of the output $\overline{A_2}$ through $\overline{A_M}$ becomes logic "1," and the AND gate 81 is opened. Thus, the control signal $D_2$ is produced from the gate 81. The nature of the overflow and the underflow can be determined simply by detecting the most significant bit (MSB), that is "$\underline{0}$" or "$\underline{1}$" (refer to the underlined logic "0" or "1" described above). When a logic "1" is produced as the MSB, the control signal $D_1$ indicating an overflow is obtained via the flip-flop 82, while when a logic "0" is produced as the MSB, the control signal $D_1$ indicating an underflow is obtained via the flip-flop 82. The flip-flop 82 is useful only for achieving a timing relationship between the signals $D_1$ and $D_2$.

Figure 9:
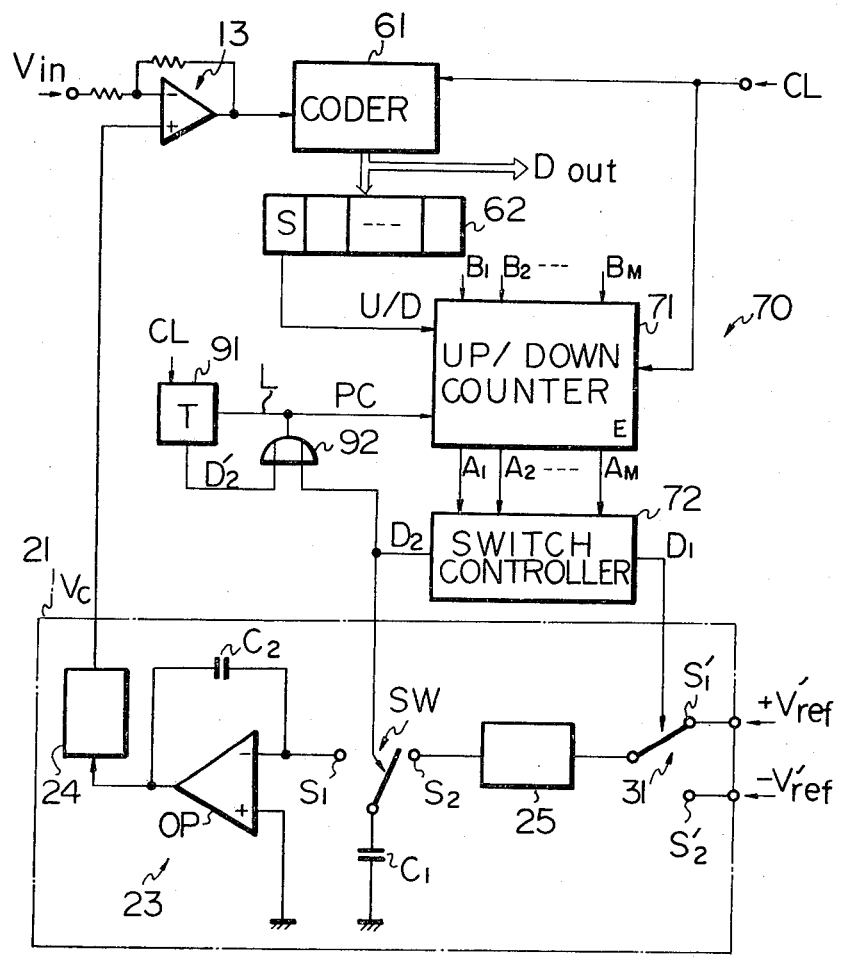
FIG. 9 is a circuit diagram of one example of a coding circuit which employs an offset compensating circuit of a third embodiment according to the present invention.
Figure 10:
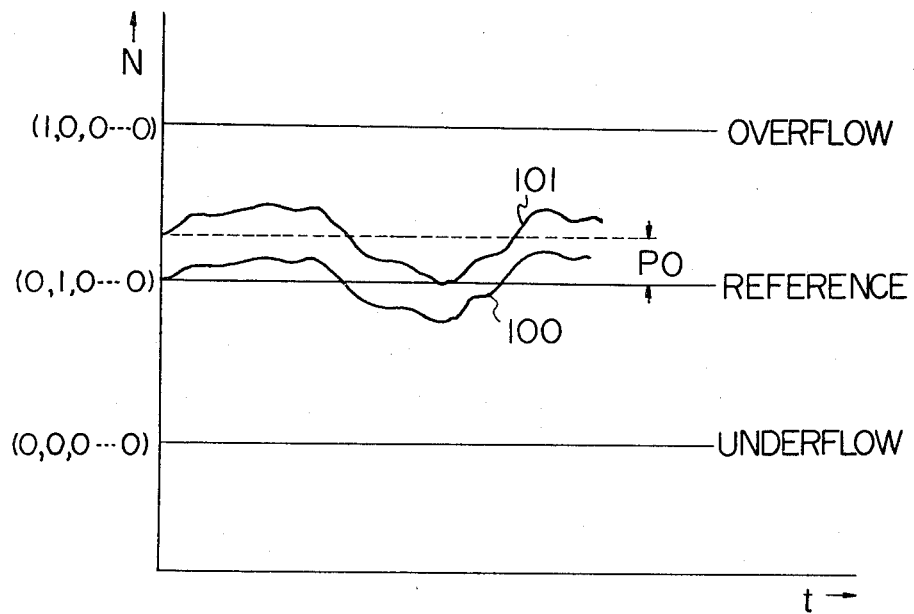
FIG. 10 is a graph used for explaining a pseudo offset arising from the up/down counter 71 illustrated in FIG. 7.

FIG. 9 is a circuit diagram of one example of a coding circuit which employs an offset compensating circuit of a third embodiment according to the present invention. The circuit according to the third embodiment further includes means for improving the offset compensating circuit according to the above mentioned second embodiment (FIG. 7). The aforementioned up/down counter 71 has a disadvantage in that the counter 71 is liable to contain a "pseudo offset" therein, which pseudo offset cannot be directly cancelled by the offset compensating circuit 21 (FIG. 7). The nature of the pseudo offset will now be clarified with reference to FIG. 10, and the cause of the pseudo offset will later be described with reference to FIG. 11. FIG. 10 is a graph used for explaining the pseudo offset accumulated and contained in the counter 71. The abscissa of the graph indicates elapsed time t and the ordinate thereof indicates a count number N representing the content of counter 71 (FIG. 7). The bits (1, 0, 0 ... 0), (0, 1, 0 ... 0) and (0, 0, 0 ... 0) respectively represent the aforesaid overflow, preset value (reference value) and underflow. The count number (see curve 100) of the successive samples varies normally along the reference value (0, 1, 0 ... 0). However, the curve 100 may shift, as a whole, upward or downward from the reference value. When, for example, an upward shift occurs, a curve 101 may be obtained. In this case, the count number of the curve 101 contains the pseudo offset which is schematically represented by PO. If the level of the pseudo offset PO becomes relatively high or low, even though there is no true offset, an overflow or the underflow will occur very frequently. Therefore, such a pseudo offset PO must be swept away from the counter 71 periodically. In FIG. 9, a timer (T) 91 operates so as to sweep the pseudo offset away from the counter 71. That is, an output signal $D_2'$ is periodically produced from the timer 91 and applied, as the preset command pulse PC, to an OR gate 92. The aforesaid control signal $D_2$ can also be applied to the counter 71 via the OR gate 92.

Every time the output signal $D_2'$ is produced by the timer 91, the signal $D_2'$ is fed back thereto via a line L. When the timer 91 receives the signal $D_2'$ via the line L, the timer 91 is reset to zero and the timer 91 starts counting the clock pulses CL. Every time the timer 91 finishes counting a predetermined number of the pulses CL, it produces the signal $D_2'$.

Thus, the output signal $D_2'$ is useful for sweeping away the pseudo offset from the counter 71. However, if the level of the true offset becomes very high or low, the counter 71 indicates the occurrence of an overflow or underflow very frequently so as to suppress the offset immediately. In this case, the output signal $D_2'$ has a bad effect on the counter 71 rather than the aforementioned good effect thereon. The reason for this is that, if the signal $D_2'$ is applied to the counter 71 very frequently, the counter 71 cannot produce underflow or overflow information very frequently because the counter 71 is unnecessarily preset by the signal $D_2'$. In order to solve the above mentioned problem, as seen from FIG. 9, the control signal $D_2$ is also applied to the timer 91 via the line L. When the signal $D_2$ is applied to the timer 91, the timer 91 is preset to zero. Accordingly, the signal $D_2'$ is not produced by the timer 91 following the appearances of the signal $D_2$ until the timer 91 finishes counting the predetermined number of pulses CL.

Figure 11:
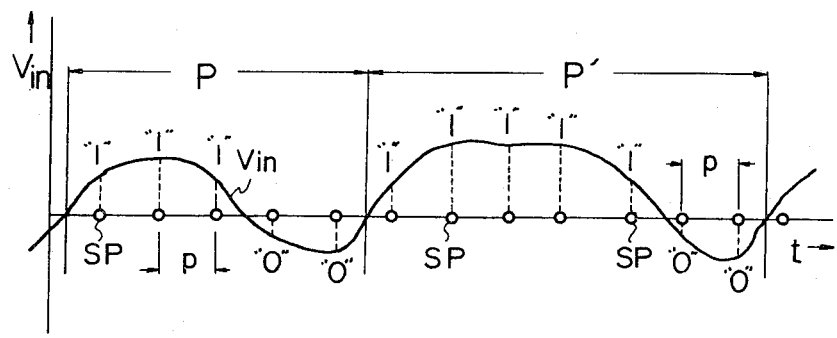
FIG. 11 is a graph used for explaining the relationship between an input voltage signal $V_{in}$ and a sampling operation.

The above mentioned pseudo offset can be suppressed by the circuitry illustrated in FIG. 9. However, such a pseudo offset can also be suppressed by a counting means. Details of such a counting means, which counts the sign bits S, will be explained hereinafter. The pseudo offset arises from the fact that the count number $N_p$ and the count number $N_n$ are not always equal to each other, where the number $N_p$ denotes the number of positive sign bits S during one period of the input voltage signal $V_{in}$ and the number $N_n$ denotes the number of negative sign bits S during the same period thereof. Referring to FIG. 11, which is a graph used for explaining the relationship between the input voltage signal $V_{in}$ and the sampling operation and for explaining the origin of the pseudo offset, the reference symbols SP denote successive sampling points having the frequency of 8 KHz according to the sampling theorem. If it is assumed that each period (P, P') of the signal $V_{in}$ has a length which is equal to a length of n×p (where the symbol p denotes each sampling period defined by the sampling points SP and the symbol n is an odd number (1, 3, 5 ... )), the number $N_p$ is not equal to the number $N_n$. For example, during the period P, the number $N_p$ ("1") is 3 and the number $N_n$ ("0") is 2. Therefore, the difference between the numbers $N_p$ and $N_n$, that is the difference $|N_p-N_n|$, becomes an odd number, that is 1. During the period P', the number $N_p$ ("1") is 5 and the number $N_n$ ("0") is 2, and the difference $|N_p-N_n|$ becomes an odd number, that is 3. In such a case, even though there if no true offset, the count number of the counter 71 will gradually increase toward (1, 0, 0 ... 0), which indicates an overflow, due to the excess of the count number $N_p$ as compared to the number $N_n$. This is the reason the pseudo offset PO (see FIG. 10) is accumulated and contained in the counter 71. Such a pseudo offset may also arise due to the presence of an excess of the count number $N_n$ as compared to the count number $N_p$, the difference being an odd number. Further, if an excess of either count number ($N_p$ or $N_n$) occurs repeatedly during successive periods (P, P'... ), the level of the pseudo offset will soon reach a very high or low level.

As will be understood from the above mentioned fact, when the following two conditions are detected, it is desirable for the up/down counter 71 to be idle so as not to accumulate the pseudo offset PO therein. The first condition is that the difference between the numbers $N_p$ and $N_n$ ($|N_p-N_n|$) becomes an odd number. Especially, the condition where the difference which is equal to 1 must be detected without fail. This is because a difference $|N_p-N_n|$ which is a relatively large number, such as 3, 5, 7 ..., can be reduced to the number 1 through the usual offset compensating operation. Accordingly, it is important to detect the condition where the difference number $|N_p-N_n|$ is equal to 1.

Figure 12:
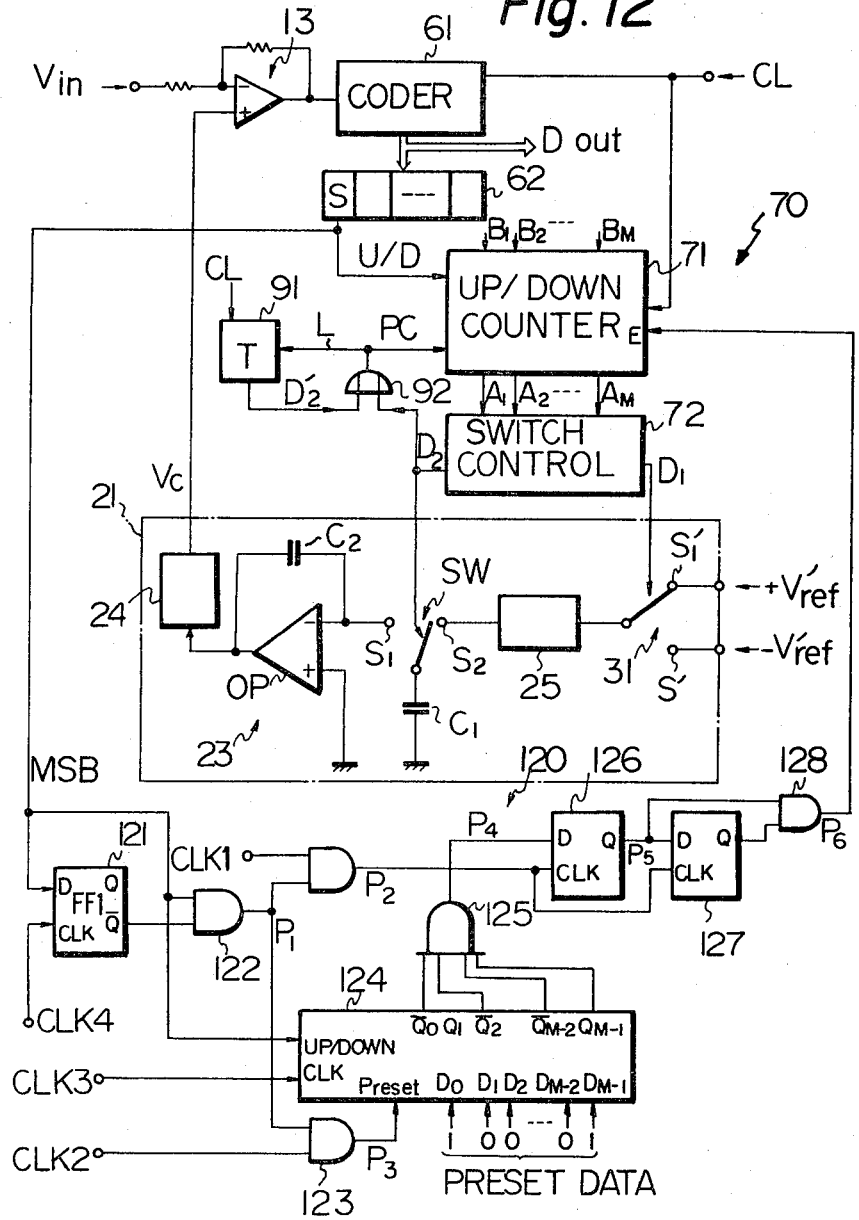
FIG. 12 is a circuit diagram of one example of a coding circuit which employs an offset compensating circuit of a fourth embodiment according to the present invention.
Figure 13:
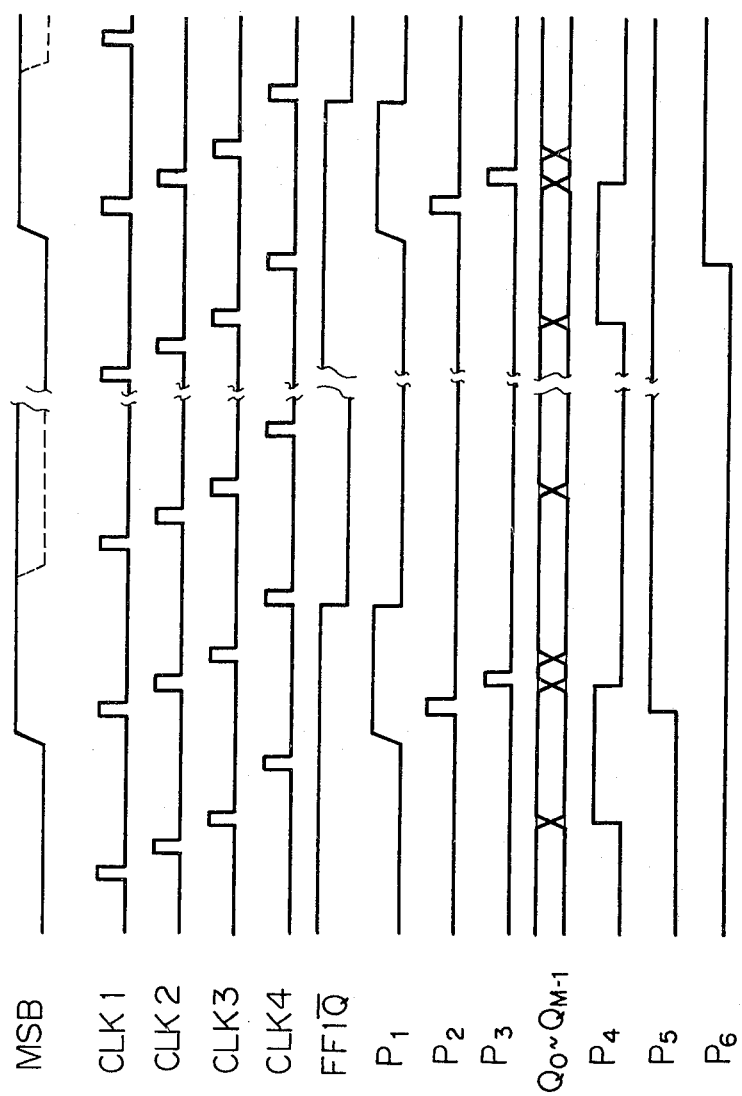
FIG. 13 depicts waveforms of signals in the circuit illustrated in FIG. 12.

The second condition is that the first condition (that is $|N_p-N_n|$ is equal to an odd number) occurs during successive intervals of k periods, where k is a positive integer except for 1. Preferably, k equals 2, but k can be 3, 4 and so on. FIG. 12 is a circuit diagram of one example of a coding circuit which employs an offset compensating circuit of a fourth embodiment according to the present invention. The fourth embodiment includes the previously mentioned counting means which operates so as to not enable the counter 71, so that the counter 71 does not accumulate the pseudo offset therein. In FIG. 12, the members which have the same reference numerals and symbols as those indicated in FIG. 9 are identical to the members in FIG. 9. The reference numeral 120 represents a counting means which detects the above mentioned two conditions and makes the counter 71 stop the counting operation via an enabling terminal E. FIG. 13 depicts waveforms of the signals appearing in the counting means 120. A D flip-flop (FF1) 121 and an AND gate 122 detects the ends of each period (see P, P' in FIG. 11). That is, the flip-flop 121 and the gate 122 detect the transitions of the sign bits S (MSB) from "0" to "1," which transitions correspond to the ends of each period of the input voltage signal $V_{in}$. At each transition of the period, the $\overline{Q}$ output produces a logic "1" and the MSB becomes logic "1". These logic "1"s are applied to the AND gate 122. Then, the gate 122 produces pulse $P_1$. The pulse $P_1$ is applied to the preset terminal (Preset) of an up/down counter 124 via an AND gate 123 in synchronism with clock pulses CLK2. Then, a predetermined initial value, that is the preset data, for example (1, 0, 0 . . . 0, 1), is loaded in the counter 124. Thereafter, the counter 124 starts counting the clock pulses CLK3 applied to the clock terminal CLK, the count increasing or decreasing according to whether the sign bit S (MSB) applied to the up/down is positive or negative specifying terminal (UP/DOWN), and then the counter 124 stops continues counting the clock pulses CLK3 for the duration of the period. As a result, the counter 124 produces the difference number $|N_p-N_n|$ during each period of the signal $V_{in}$. When the next pulse $P_1$ is supplied from the gate 122, this pulse $P_1$ is applied to the present terminal (Preset) of the counter 124. An AND gate 125 detects whether or not the difference number $|N_p-N_n|$ is equal to 1. If the difference number $(N_p-N_n)$ equals $-1$, the count number is changed from (1, 0, 0 . . . 0, 1) to (1, 0, 0 . . . 1, 0). Contrary to this, if the difference number $(N_p-N_n)$ equals $-1$, the count number is changed from (100 . . . 01) to (100 . . . 00). Accordingly, the output $(Q_{M-1}, Q_{M-2}, Q_{M-3} \ldots Q_0)$ of the counter 124 becomes all "1", in either of the cases where the difference number $(N_p-N_n)$ becomes $+1$ or $-1$. (It should be noted that the bit $Q_1$ is not applied to the gate 125). Thus, an output $P_4$ from the gate 125 represents the occurrence of said first condition, that is, the difference number $|N_p-N_n|$ becomes equal to 1. Next, the occurrence of said second condition is detected by means of a D flip-flop 126, a D flip-flop 127 and an AND gate 128. That is, a pulse $P_6$ from the gate 128 indicates that two periods, in each of which the number $|N_p-N_n|$ has been equal to 1, have occurred successively. When one period includes occurs in which the number $|N_p-N_n|$ is equal to 1, this information about the number $|N_p-N_n|$ is loaded in the flip-flop 127. Further, if the next period is also characterized by the number $|N_p-N_n|$ being equal to 1, this information is loaded in the flip-flop 126. In this case, both Q outputs of the flip-flops 126 and 127 become "1," and the AND gate 128 is opened. The pulse $P_6$ from the gate 128 is applied to the enabling terminal E of the counter 71, in order to stop the counting operation thereof, in order not to accumulate the pseudo offset PO in the counter 71.

As mentioned above, according to the present invention, an offset compensating circuit which is easily fabricated as an LSI circuit, can be obtained.

What is claimed is:

1. An offset compensating circuit which is incorporated in a circuit to be compensated for an offset induced therein, comprising:
    bipolar voltage generator means for producing either a positive reference voltage or a negative reference voltage in accordance with the polarity of an output signal produced from said circuit to be compensated; and
    switched capacitor type integration circuit means for receiving said positive or negative reference voltage from said bipolar voltage generator means and producing an offset compensating voltage to be combined with an input signal to be applied to said circuit to be compensated in a negative feedback mode, wherein the switched capacitor type integration circuit means is comprised of a first capacitor acting as a sample-and-hold capacitor, an operational amplifier connected to a second capacitor acting as an integration capacitor, and switching means for alternately charging the first capacitor by said positive or negative reference voltage and transferring the charge of said first capacitor to said second capacitor.

2. A circuit as set forth in claim 1, wherein the bipolar voltage generator means comprises a switch having first contact means for receiving the positive reference voltage, second contact means for receiving the negative reference voltage, and means for transferring a signal proportional to either the positive reference voltage or negative reference voltage to the switching means in the switched capacitor type integration circuit means.

3. A circuit as set forth in claim 1, further comprising a voltage divider connected between the output of the switched capacitor type integration circuit means and the circuit to be compensated.

4. A circuit as set forth in claim 1, further comprising a voltage divider connected between the switched capacitor type integration circuit means and the bipolar voltage generator means.

5. A circuit as set forth in claim 1, further comprising buffer means for receiving the output signal of the circuit to be compensated and driving the switched capacitor type integration circuit means, the buffer means being not responsive to the variation of the output signal itself of the circuit to be compensated, but being responsive only to the offset-induced variation of the output signal.

6. A circuit as set forth in claim 5, wherein the buffer means comprises up/down counter means for counting clock pulses up or down from a preset number which has been load therein in accordance with the polarity of the output signal of the circuit to be compensated.

7. A circuit as set forth in claim 6, wherein the buffer means further comprises controller means for receiving the output of the up/down counter means and producing a first control signal and a second control signal, the first control signal specifying either a positive reference voltage or negative reference voltage of the bipolar voltage generator means in accordance with the occurrence of an underflow or overflow of the up/down counter means, and the second control signal operating to drive the switching means and also to load the preset number in the up/down counter means.

8. A circuit as set forth in claim 7, wherein the controller means is comprised of an AND gate and a flip-flop, both receiving the output of the up/down counter means when an overflow or underflow occurs, respectively, the AND gate receiving inverted output bits, except for the most significant bit of said output of the up/down counter means, and producing the second control signal, the flip-flop receiving the said most significant bit and producing the first control signal.

9. A circuit as set forth in claim 7, further comprising means for sweeping away a pseudo offset from the up/down counter means, which pseudo offset is not a true offset induced in the circuit to be compensated but is accumulated and contained in the up/down counter means.

10. A circuit as set forth in claim 9, wherein the means for sweeping away the psuedo offset comprises a timer which periodically produces pulses for loading the preset number in the up/down counter means.

11. A circuit as set forth in claim 10, further comprising means responsive to the second control signal for resetting the timer to zero every time the second control signal from the controller is applied thereto.

12. A circuit as set forth in claim 6, further comprising detecting means for detecting the occurrences of both a first condition and a second condition and producing a signal for inhibiting the counting operation of the up/down counter means, said first condition being that the absolute value of the difference between the numbers $N_p$ and $N_n$ is an odd number, said second condition being that said first condition occurs during k successive periods of the output signal from the circuit to be compensated, where k is a positive integer, where $N_p$ denotes an integer corresponding to the length of time that the output signal of the circuit to be compensated is positive during one period of the output signal of the circuit to be compensated, and where $N_n$ denotes an integer corresponding to the length of time that the output signal of the circuit to be compensated is negative during one period of the output signal of the circuit to be compensated.

13. A circuit as set forth in claim 12, wherein the number $|N_p-N_n|$ is 1, and the number k is 2.

14. A circuit as set forth in claim 13, wherein the detecting means comprises end identifying means for detecting the ends of periods of the output signal of the circuit to be compensated, the end identifying means comprising a D flip-flop responsive to a signal corresponding to the polarity of the output signal of the circuit to be compensated and an AND gate having a first input responsive to the signal corresponding to the polarity of the output signal of the circuit to be compensated and a second input responsive to the $\bar{Q}$ output of the D flip-flop.

15. A circuit as set forth in claim 14, wherein the detecting means further comprises an up/down counter having a preset input responsive to the output from the AND gate and an up/down specifying input responsive to a signal corresponding to the polarity of the output signal of the circuit to be compensated, and decoding means for receiving the output of the up/down counter and producing an output signal indicating the occurrence of the first condition, that is $N_p-N_n$ being equal to 1.

16. A circuit as set forth in claim 14, wherein the detecting means further comprises first and second additional flip-flops and an additional AND gate, said first additional flip-flop being set by the occurrence of the first condition and said second additional flip-flop being set by the occurrence of a preceding first condition, the additional AND gate receiving both Q outputs of said first and second additional flip-flops, whereby the output from the additional AND gate indicates the occurrence of said second condition.

17. An offset-compensated circuit, comprising:
a differential amplifier fabricated on an integrated circuit chip, the differential amplifier being responsive to a first signal and to a compensating signal;
first means fabricated on the integrated circuit chip and responsive to the output of the differential amplifier for emitting a second signal; and
compensating circuit means fabricated on the integrated circuit and responsive to the second signal for generating a compensating signal for the differential amplifier, the compensating circuit means comprising
a second amplifier having an input and an output,
an integration capacitor connected between the input and the output of the second amplifier,
a sample-and-hold capacitor,
second means responsive to the second signal for alternately charging the sample-and-hold capacitor and discharging it to the integration capacitor, and
third means connected to the output of the second amplifier for delivering the compensating signal to the differential amplifier.

18. The circuit of claim 17, wherein the second means comprises bipolar reference voltage generator means for generating a reference voltage whose polarity is determined by the second signal, and means for periodically charging the sample-and-hold capacitor with a voltage proportional to a reference voltage and then discharging it to the integration capacitor.

19. The circuit of claim 18, wherein the bipolar reference voltage generator means comprises means for setting a positive reference voltage, means for setting a negative reference voltage, and first switch means responsive to the second signal for periodically selecting one of the positive and negative reference voltages.

20. The circuit of claim 19, wherein the bipolar reference voltage generator means additionally comprises a pair of series-connected resistors forming a voltage divider, the reference voltage selected by the first switch means being applied to the voltage divider.

21. The circuit of claim 20, wherein the means for periodically charging the sample-and-hold capacitor with a voltage proportional to a reference voltage and then discharging it to the integration capacitor comprises second switch means for periodically connecting the sample-and-hold capacitor to the voltage divider and then to the integration capacitor.

22. The circuit of claim 21, wherein the third means comprises a voltage divider connected between the output of the second amplifier and the differential amplifier.

23. The circuit of claim 22, wherein the first means comprises coder means for periodically generating the second signal in the form of a multi-bit digital signal corresponding to the first signal, one of the bits being a sign bit, and wherein the bipolar reference voltage generator means sets a positive reference voltage when the sign bit is "1" and a negative reference voltage when the sign bit is "0".

24. The circuit of claim 17, wherein the third means comprises coder means responsive to clock pulses for generating the second signal in the form of a multi-bit digital signal corresponding to the first signal, one of the bits of the multi-bit digital signal being a sign bit, the second means being responsive to the sign bit.

25. The circuit of claim 24, wherein the second means comprises means for setting a positive reference voltage, means for setting a negative reference voltage, first switch means for selecting one of the positive and negative reference voltages, second switch means for charging the sample-and-hold capacitor with a voltage proportional to the reference voltage selected by the first switch means and for discharging the sample-and-hold capacitor to the integration capacitor, and means responsive to the sign bit for controlling the first and second switch means.

26. The circuit of claim 25, wherein the means responsive to the sign bit for controlling the first and second switch means comprises an up/down counter susceptible to accumulation of a pseudo offset, and wherein the second means additionally comprises means for diminishing the pseudo offset.

27. The circuit of claim 24, wherein the second means comprises presettable up/down counter means responsive to the sign bit for counting clock pulses to increment the content of the couner means when the sign bit is in one state and to decrement the content of the counter when the sign bit is in the other state, and switch controller means connected to the counter means for generating a first control signal when the content of the counter means is different from the preset value by a predetermined amount and for generating a second control signal indicating whether, at the time the first control signal appears, the content of the counter means is greater than the preset value.

28. The circuit of claim 27, wherein the switch controller means comprises a gate having inputs responsive to all but the most significant bit of the output of the counter means, the first control signal being provided by the output of the gate, and a flip-flop having a D input responsive to the most significant bit of the output of the counter means, a clock input connected to the output of the gate, and an output, the second control signal being provided by the output of the flip-flop.

29. The circuit of claim 27, wherein the second means further comprises means for setting a positive reference voltage, means for setting a negative reference voltage, first switch means controlled by the second control signal for selecting one of the positive and negative reference voltages, and second switch means controlled by the first control signal for charging the sample-and-hold capacitor with a voltage proportional to the reference voltage selected by the first switch means and for discharging the sample-and-hold capacitor to the integration capacitor.

30. The circuit of claim 29, wherein the first switch means is connected to the second switch means by a voltage divider and wherein the third means comprises a voltage divider.

31. The circuit of claim 30, wherein the second means further comprises resettable timer means for generating a timer signal after a predetermined number of clock pulses, and an OR gate having a first input responsive to the first control signal and a second input responsive to the timer signal, the output of the OR gate resetting the timer means and loading the preset value into the counter means.

32. The circuit of claim 31, wherein the second means additionally comprises means responsive to the sign bit for dis-enabling the counter means if, during a predetermined number of consecutive periods of the second signal, the number of digital signals indicating that the second signal is positive differs from the number of digital signals indicating that the second signal is negative by a predetermined number.

33. The circuit of claim 31, wherein the second means additionally comprises means responsive to the sign bit for dis-enabling the counter means if, during two consecutive periods of the second signal, the number of digital signals indicating that the second signal is positive differs from the number of digital signals indicating that the second signal is negative by one.

34. The circuit of claim 33, wherein the means for dis-enabling the counter means comprises means responsive to the sign bit for signaling the end of each period of the second signal, additional up/down presettable counter means responsive to the sign bit and to the means for signaling the end of each period of the second signal for accumulating the difference between the number of digital signals indicating that the second signal is positive and the number of digital signals indicating that the second signal is negative during each period of the second means, decoder means responsive to the output of the aditional counter means for determining whether the output thereof is one, and means responsive to the gate means for emitting a signal to the counter means when the output of the decoder means is one during two consecutive periods of the second signal.

* * * * *

UNITED STATES PATENT AND TRADEMARK OFFICE
CERTIFICATE OF CORRECTION

PATENT NO. : 4,377,759  
DATED : March 22, 1983  
INVENTOR(S) : Ohhata et al.

Page 1 of 3

It is certified that error appears in the above-identified patent and that said Letters Patent is hereby corrected as shown below:

Front page [75], Inventors,
- line 1, "Kawasaki" should be --Yokohama--;
- line 2, "Yokohama" should be --Kawasaki--;
- line 5, "Kawasaki" should be --Nasu--.

[73], Assignee: "Konishiroku Photo Industry Co., Ltd." should be --Fujitsu Limited--.

[57], Abstract,
- line 5, delete "means";
- line 6, delete "means".

Front page [30], Foreign Application Priority Data,
after "Jun. 4, 1979 [JP] Japan................54-68802"
insert --Jun. 14, 1979 [JP] Japan..............54-73953
Dec. 14, 1979 [JP] Japan..............54-162517--.

Col. 1, line 38, change "produced" to --production--;
line 45, "input," should be --input/--;
line 49, "produced" should be --production--.

Col. 2, line 13, "probablity" should be --probability--;
line 19, after "DESCRIPTION" insert --OF--.

UNITED STATES PATENT AND TRADEMARK OFFICE
CERTIFICATE OF CORRECTION

PATENT NO. : 4,377,759  
DATED : March 22, 1983  
INVENTOR(S) : Ohhata et al.

Page 2 of 3

It is certified that error appears in the above-identified patent and that said Letters Patent is hereby corrected as shown below:

Col. 4, line 32, after "23" insert --substantially--;
       line 38, after "circuit" insert --,--;
       line 57, "+$V_r$or" should be --+$V_r$ or--;

Col. 6, line 30, "negativbe" should be --negative--;
       line 46, "$V_i$is" should be --$V_i$ is--;
       line 62, "+$V_r$or-$V_r$for" should be --+$V_r$ or -$V_r$ for--.

Col. 7, line 38, "indicates" should be --indicate--;
       line 47, "+$V_{ref}'$ and -$V_{ref}'$" should be --+$V_{ref}'$ and -$V_{ref}'$--.

Col. 8, line 8, after "$V_{in}$" insert --,--;
       line 37, delete "the".

Col. 10, line 16, "-$V_{ref}'$" should be --$V_{ref}'$--;
       line 19, "positve" should be --positive--;
       line 29, "provides" should be --provided--.

UNITED STATES PATENT AND TRADEMARK OFFICE
CERTIFICATE OF CORRECTION

PATENT NO. : 4,377,759

DATED : March 22, 1983

INVENTOR(S) : Ohhata et al.

It is certified that error appears in the above-identified patent and that said Letters Patent is hereby corrected as shown below:

Col. 12, line 15, "if" should be --is--;

Col. 12, line 60, "detects" should be --detect--.

Col. 13, line 8, delete "is positive or nega-";
line 9, delete "tive"; after "(UP/DOWN)" insert --is positive or negative--;
line 10, delete "stops";
line 18, "-1" should be --+1--;
line 22, "$Q_{M-2}$" should be --$\overline{Q}_{M-2}$--;
line 34, delete "includes";
line 48, delete ",".

Col. 17, line 4, "couner" should be --counter--.
Col. 18, line 33, "aditional" should be --additional--.

Signed and Sealed this

First Day of May 1984

[SEAL]

Attest:

GERALD J. MOSSINGHOFF

Attesting Officer

Commissioner of Patents and Trademarks